United States Patent [19]

Miwada

[11] Patent Number: 5,103,278
[45] Date of Patent: Apr. 7, 1992

[54] CHARGE TRANSFER DEVICE ACHIEVING A HIGH CHARGE TRANSFER EFFICIENCY BY FORMING A POTENTIAL WELL GRADIENT UNDER AN OUTPUT-GATE AREA

[75] Inventor: Kazuo Miwada, Tokyo, Japan

[73] Assignee: NEC Corporation, Tokyo, Japan

[21] Appl. No.: 693,164

[22] Filed: Apr. 29, 1991

Related U.S. Application Data

[63] Continuation-in-part of Ser. No. 478,855, Feb. 12, 1990, abandoned.

[30] Foreign Application Priority Data

Feb. 11, 1989 [JP] Japan .................... 1-32430

[51] Int. Cl.$^5$ ............................... H01L 29/78
[52] U.S. Cl. ...................... 357/24; 307/304; 377/60; 377/68
[58] Field of Search ............... 357/24, 24 M; 307/304; 377/60, 58

[56] References Cited

U.S. PATENT DOCUMENTS

| | | | |
|---|---|---|---|
| 3,796,932 | 3/1974 | Amelio et al. | 307/304 |
| 4,499,590 | 2/1985 | Bluzer | 377/60 |
| 4,839,911 | 6/1989 | Boucharlat | 357/24 |
| 4,862,235 | 8/1989 | Hayes et al. | 357/24 |
| 4,910,569 | 3/1990 | Erhardt | 357/24 |
| 4,992,842 | 2/1991 | Yang et al. | 357/24 M |

FOREIGN PATENT DOCUMENTS

| | | | |
|---|---|---|---|
| 2259437 | 8/1975 | France | 357/24 |
| 59-65470 | 4/1984 | Japan | 357/24 |

Primary Examiner—Andrew J. James
Assistant Examiner—Daniel N. Russell
Attorney, Agent, or Firm—Sughrue, Mion, Zinn, Macpeak & Seas

[57] ABSTRACT

A charge transfer device is fabricated on a semiconductor substrate of a first conductivity type and comprises a well formed in a surface portion of the semiconductor substrate and having a second conductivity type opposite to the first conductivity type, a charge transfer region of the first conductivity type formed in a surface portion of the well, a floating diffusion region of the first conductivity type formed in the surface portion of the well and contiguous to the charge transfer region, an insulating film covering the surface portion of the well, and a plurality of gate electrodes provided on the insulating film and applied with driving clocks in such a manner as to produce conductive channels in the charge transfer region for transferring electric charges toward the floating diffusion region, in which the channels in the vicinity of the floating diffusion region are gradually decreased in width toward the floating diffusion region, and in which impurity atoms of the well beneath the charge transfer region in the vicinity of the floating diffusion region are graded toward the floating diffusion region, so that the electric charges are allowed to be swept thereinto without any residual.

7 Claims, 7 Drawing Sheets 5,103,278

CHARGE TRANSFER DEVICE ACHIEVING A HIGH CHARGE TRANSFER EFFICIENCY BY FORMING A POTENTIAL WELL GRADIENT UNDER AN OUTPUT-GATE AREA

This is a continuation-in-part of application Ser. No. 07/478,855 field Feb. 12, 1990 now abandoned.

BACKGROUND OF THE INVENTION

1. Field of the Invention

This invention relates to a charge transfer device and, more particularly, to a configuration of a well where a charge transfer line is formed.

2. Description of the Related Art

A charge transfer device is operative to transfer data in the form of electric charges from stage to stage and widely used as an image sensor and a delay unit.

A typical example of the charge transfer device is illustrated in FIGS. 1 to 3 and fabricated on an n-type semiconductor substrate 1. In the semiconductor substrate 1 is formed a p-type well 2 where an n-type charge transfer region 3, a floating diffusion region 4 and a drain region 5 are surrounded by a p-type channel stopper region 6. A plurality of small p-type regions 7 and 8 are formed in the charge transfer region 3 at a predetermined spacing for providing potential barriers between adjacent n-type sub-regions forming parts of a transfer line, and the charge transfer region 3 is covered with an oxide film Ox. Although the n-type charge transfer region 3 extends in the right direction of FIGS. 1 and 2 for providing a large number of charge transfer stages, only two stages located at the terminal end of the transfer line are shown in the figures. Most of the charge transfer region 3 and, accordingly, channels of transfer stages are relatively large in width W1, but the channel width is decreased toward the floating diffusion region 4 as will be seen from FIG. 1.

Arranged on the oxide film Ox are transfer gate electrodes 9 to 12, output gate electrodes 13 and 14 which are slightly overlapped with one another, and a reset gate electrode 15 provided over the area between the floating diffusion region 4 and the drain region 5. The transfer gate electrodes 9 and 10 are coupled to a first clock source (not shown) for producing a first phase clock signal CL1, and the transfer gate electrodes 11 and 12 are coupled to a second clock source (not shown) for producing a second phase clock signal CL2. The output gate electrodes 13 and 14 are supplied with a constant voltage level Vc, and a reset pulse signal CLr is supplied to the reset gate electrode 15. Since the drain region 5 is coupled to another constant voltage level Vdd, the floating diffusion region 4 is balanced in voltage level with the drain region 5 upon application of the reset pulse signal CLr to the reset gate electrode 15. The p-type well 2 is grounded, and the semiconductor substrate 1 is positively biased.

In operation, the first and second phase clock signals CL1 and CL2 are alternatively supplied to the transfer gate electrodes 9 to 12, and data signals in the form of electric charges are transferred from the right side to the left side of FIG. 2 in synchronization with the clock signals CL1 and CL2. Each data signal finally reaches the sub-region beneath the transfer gate electrode 12, and is further relayed to the floating diffusion region 4 through that area under the output gate electrodes 13 and 14.

When the data signal reaches the floating diffusion region 4, the potential level therein is varied and, then, detected by a source follower amplifier 16 for producing an output signal. The variation of the voltage level $dV_{SIG}$ in the floating diffusion region 4 is given as follows:

$$dV_{SIG} = Q_{SIG}/C_{FD}$$

where $Q_{SIG}$ is the amount of electric charges of the data signal and $C_{FD}$ is the capacitance applied to the floating diffusion region 4. The floating diffusion region 4 is smaller in width than the n-type charge transfer region 3, and, for this reason, the ratio of the amount of the electric charges $Q_{SIG}$ to the capacitance $C_{FD}$ is relatively large. This results in the output signal widely swinging its voltage level or a large charge-to-voltage converting gain.

However, a problem is encountered in the prior art charge transfer device shown in FIGS. 1 to 3 in that a narrow channel phenomenon takes place in the charge transfer line due to the decrease in channel width at the terminal end of the charge transfer line. In detail, it is well known that the potential depth becomes small by decreasing the channel width, and this phenomenon or the narrow channel phenomenon is causative of non-transferred electric charges Qn due to acclivities of the potential edge as shown in FIG. 3. The electric charges thus left in the transfer stages deteriorate the charge transferring efficiency. On the other hand, if the channel width is increased, the voltage variation is restricted within a relatively narrow range. Thus, there is a trade-off between the charge-to-voltage converting gain and the charge transferring efficiency. A large charge-to-voltage converting gain results in a wide dynamic range of the output signal level.

SUMMARY OF THE INVENTION

It is therefore an important object of the present invention to provide a charge transfer device which achieves a large charge-to-voltage converting gain without any sacrifice of charge transferring efficiency.

It is also an important object of the present invention to provide a charge transfer device which transfers electric charges at an improved speed.

To accomplish the above mentioned objects, the present invention proposes to gradually decrease the impurity concentration of a well together with channel width.

In accordance with the present invention, there is provided a charge transfer device fabricated on a semiconductor substrate of a first conductivity type, comprising: a) a well formed in a surface portion of the semiconductor substrate and having a second conductivity type opposite to the first conductivity type; b) a charge transfer region of the first conductivity type formed in a surface portion of the well; c) a floating diffusion region of the first conductivity type formed in the surface portion of the well and contiguous to the charge transfer region; d) an insulating film covering the surface portion of the well; and e) a plurality of gate electrodes provided on the insulating film and applied with driving clocks in such a manner as to produce conductive channels in the charge transfer region for transferring electric charges toward the floating diffusion region, the conductive channels in the vicinity of the floating diffusion region being gradually decreased in width toward the floating diffusion region, in which the density of impurity atoms of the well beneath the charge transfer region in the vicinity of the floating diffusion region is graded toward the floating diffusion region so that the electric charges are allowed to swept thereinto.

BRIEF DESCRIPTION OF THE DRAWINGS

The features and advantages of a charge transfer device according to the present invention will be more clearly understood from the following description taken in conjunction with the accompanying drawings in which.

DETAILED DESCRIPTION OF THE PREFERRED EMBODIMENTS

First Embodiment

Figure 1:
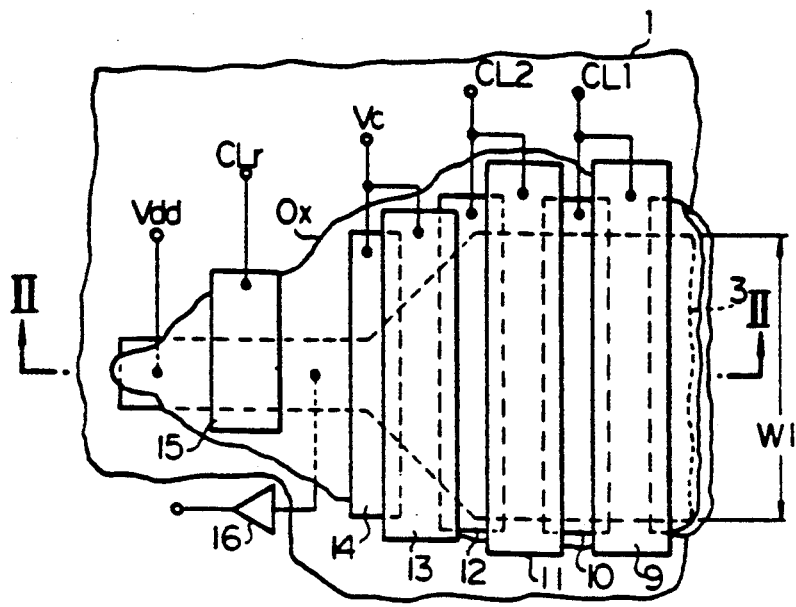
FIG. 1 is a plan view showing the prior art charge transfer device.
Figure 2:
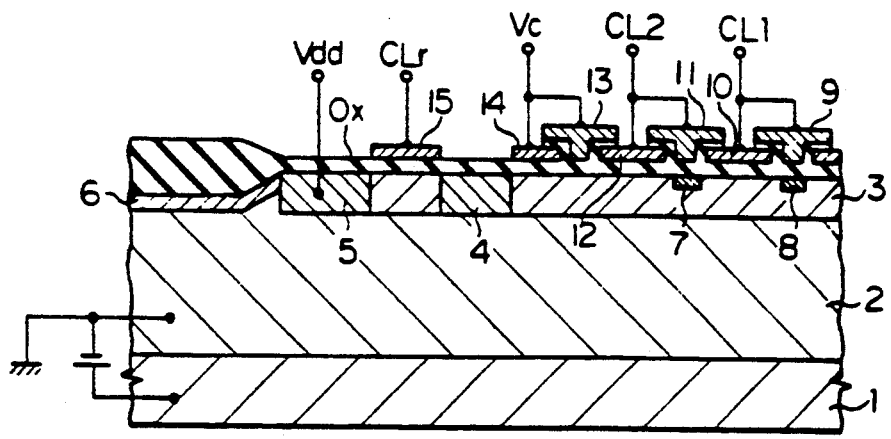
FIG. 2 is a cross sectional view taken along line II—II of FIG. 1 and showing the structure of the prior art charge transfer device.
Figure 3:
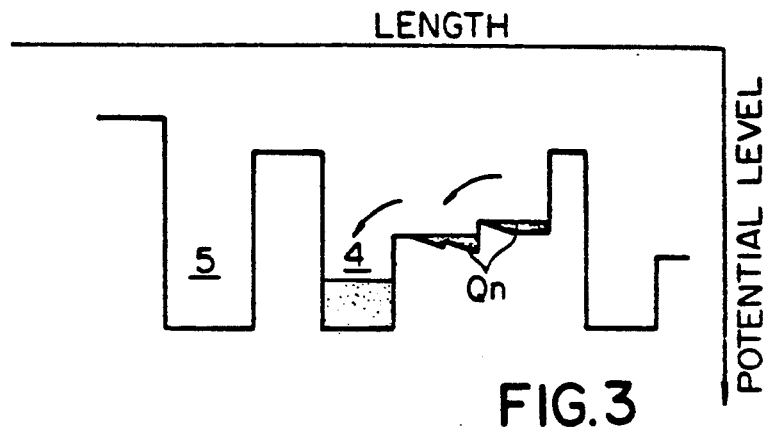
FIG. 3 is a diagram showing the potential profile along a charge transfer line incorporated in the charge transfer device shown in FIG. 1.
Figure 4:
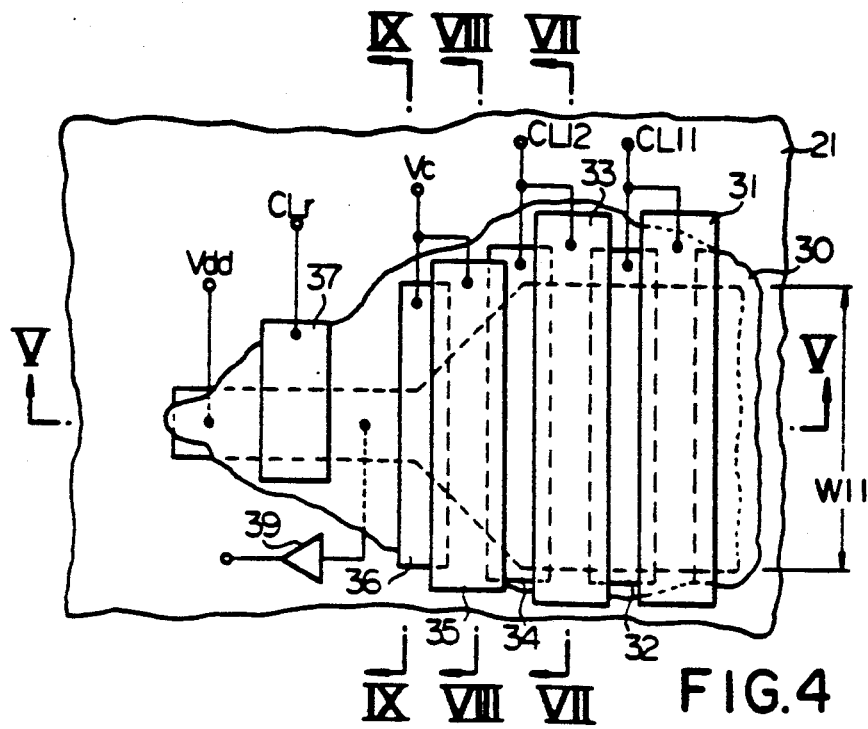
FIG. 4 is a plan view showing the layout of electrodes incorporated in a charge transfer device embodying the present invention.
Figure 5:
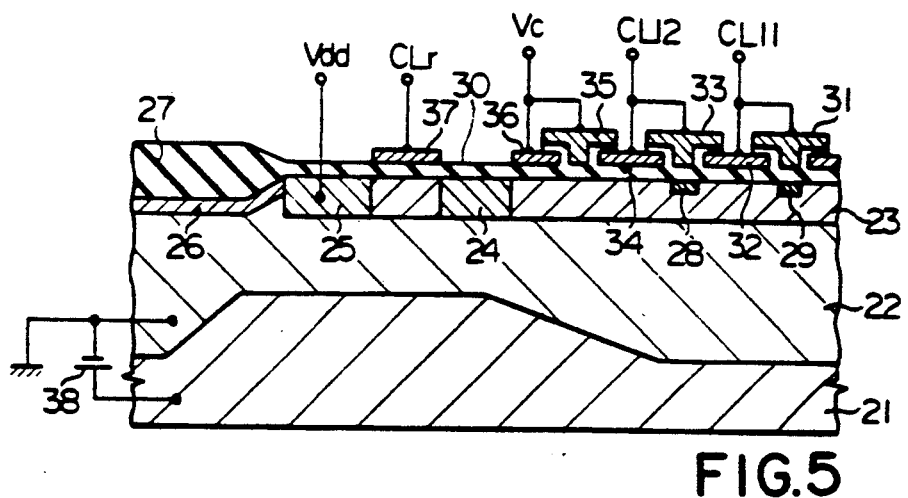
FIG. 5 is a cross sectional view taken along line V—V of FIG. 4 and showing the structure of the charge coupled device.

Referring to FIGS. 4 and 5, a charge coupled device is fabricated on an n-type semiconductor substrate 21, and a p-type potential well or well 22 is formed in the semiconductor substrate 21. In the p-type well 22 is formed an n-type charge transfer region 23, an n-type floating diffusion region 24 and an n-type drain region 25 which are surrounded by a p-type channel stopper region 26 beneath a thick field oxide film 27. A region between the floating diffusion region 24 and the drain region 25 is of the p-type region. The n-type charge transfer region 23 provides a charge transfer line for transferring data signals each in the form of electric charge packets, and the charge transfer line has a plurality of charge transfer stages. A plurality of small p-type regions 28 and 29 are formed in the charge transfer region 23 at a predetermined spacing for providing potential barriers between the adjacent charge transfer stages, and the charge transfer region 23 is covered with a thin oxide film 30. Although the n-type charge transfer region 23 extends in the right direction of FIGS. 4 and 5 for providing a large number of the charge transfer stages, only two stages located at the terminal of the transfer line are shown in the figures for the sake of simplicity. In this instance, the charge transfer line terminates at the floating diffusion region 24.

On the thin oxide film 30 are arranged transfer gate electrodes 31 to 34, output gate electrodes 35 and 36 which are two adjacent electrodes that are slightly overlapped with one another, and a reset gate electrode 37 provided over the area between the floating diffusion region 24 and the drain region 25. The transfer gate electrodes 31 and 32 are coupled to a first clock source (not shown) for producing a first phase clock signal CL11, and the transfer gate electrodes 33 and 34 are coupled to a second clock source (not shown) for producing a second phase clock signal CL12. The output gate electrodes 35 and 36 are applied with a constant voltage level Vc, and a reset pulse signal CLr is supplied to the reset gate electrode 37. Since the drain region 25 is coupled to another constant voltage level Vdd, the floating diffusion region 24 is forcibly equalized in voltage level with the drain region 25 upon application of the reset pulse signal CLr to the reset gate electrode 37. The p-type well 22 is grounded, and the semiconductor substrate 21 is positively biased by means of a source of positive voltage level 38. A source follower amplifier circuit 39 is coupled to the floating diffusion region 24, and the amount of electric charges in the floating diffusion region 24 is proportionally converted into a voltage signal.

Figure 6:
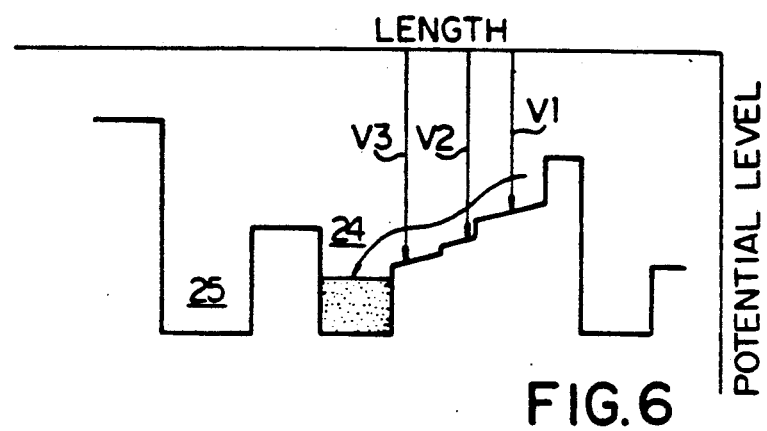
FIG. 6 is a diagram showing the potential profile along a charge transfer line incorporated in the charge transfer device shown in FIG. 4.

The charge coupled device thus arranged is characterized by the configuration of the p-type well 22. In particular, the p-type well is gradually decreased in depth toward the floating diffusion region 24 as will be better seen from FIG. 5. The part of the p-type well 22 thus decreased in depth is hereinbelow referred to as "graded region". The graded region is gradually decreased in the p-type impurity concentration toward the floating diffusion region 24 so that the undesirable narrow channel phenomenon is cancelled by the graded region even though a channel width W11 of the charge transfer line is reduced toward the floating diffusion region 24. If the p-type impurity concentration is decreased, a depletion layer tends to deeply extend into the p-type well 22, and accordingly, the potential edge is lowered as illustrated in FIG. 6. This declining potential edge not only cancels the acclivity due to the narrow channel phenomenon but also accelerates the charge transfer because a desirable electric field takes place along the declining potential edge. Then, all of the electric charges are swept into the floating diffusion region 24, and no electric charges are left in the charge transfer line.

Figure 7:
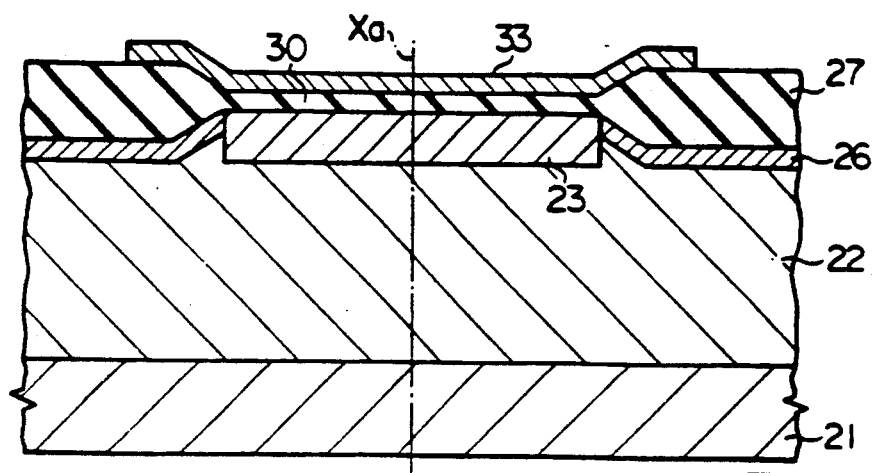
FIG. 7 is a cross sectional view taken along line VII—VII and showing the structure of the charge transfer device shown in FIG. 4.
Figure 8:
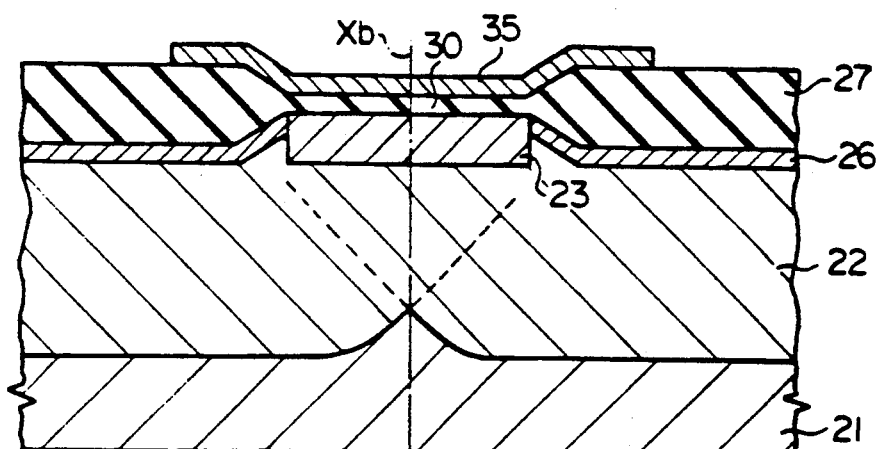
FIG. 8 is a cross sectional view taken along line VIII—VIII and showing the structure of the charge transfer device shown in FIG. 4.
Figure 9:
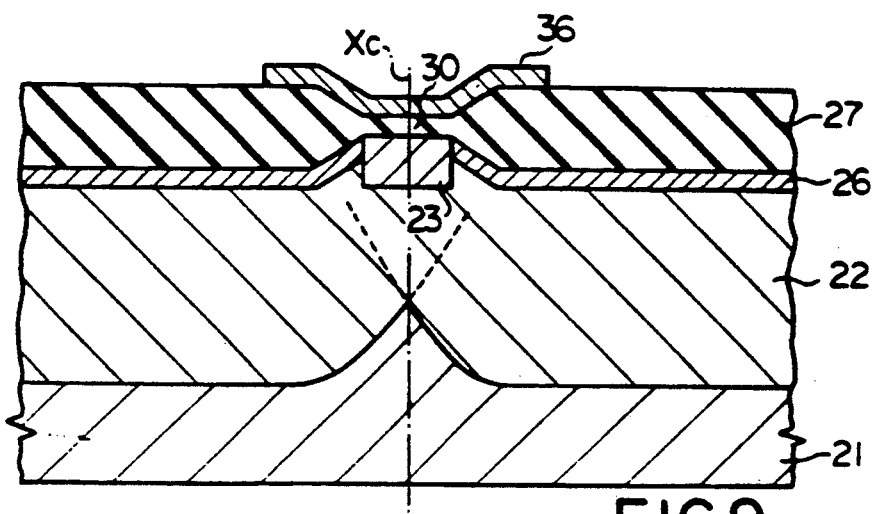
FIG. 9 is a cross sectional view taken along line IX—IX of FIG. 4 and showing the structure of the charge coupled device.

Such a graded impurity concentration profile is formed as follows. Turning to FIGS. 7 to 9 of the drawings, the bottom surface of the p-type well 22 is successively varied. This is because of the fact that p-type impurity atoms are introduced from both sides of the line V—V through lateral diffusion. If the p-type impurity atoms are laterally diffused from both sides, the impurity concentration is dependent on the distance from the diffusion source. The p-type impurity atoms diffused from the two sources are merged with each other around the center region under the electrodes 33 to 36, however, the p-type well 22 becomes shallow with distance from the sources. This results in that the impurity concentration is decreased with depth of the p-type well toward the terminal end of the charge transfer line.

Figure 10:
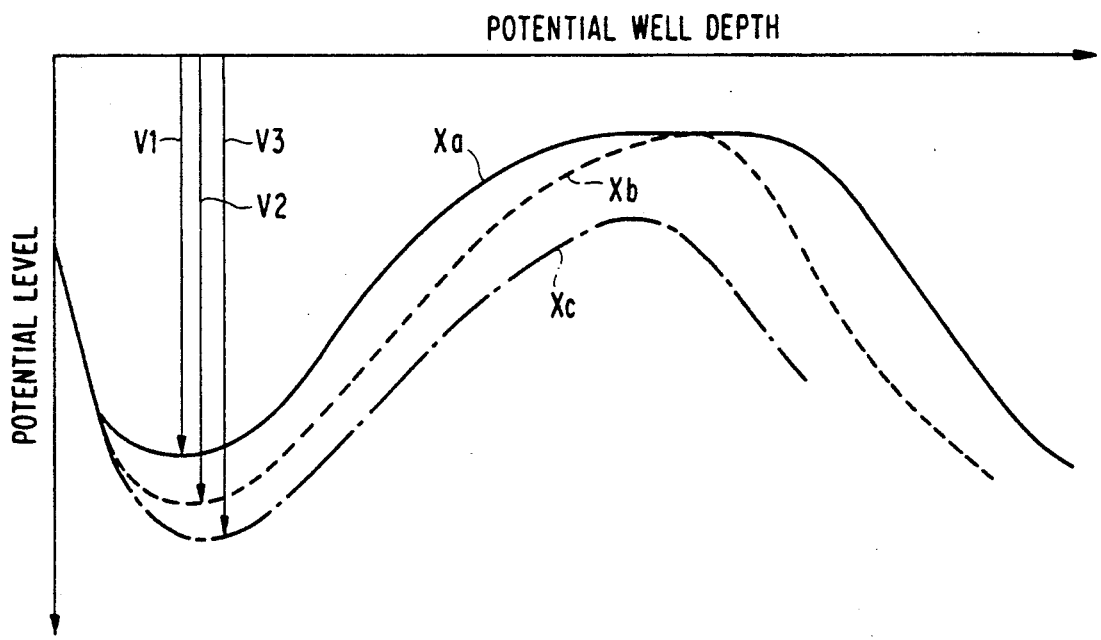
FIG. 10 is a graph showing potential profiles along respective lines Xa, Xb and Xc of FIGS. 7 to 9.
Figure 11:
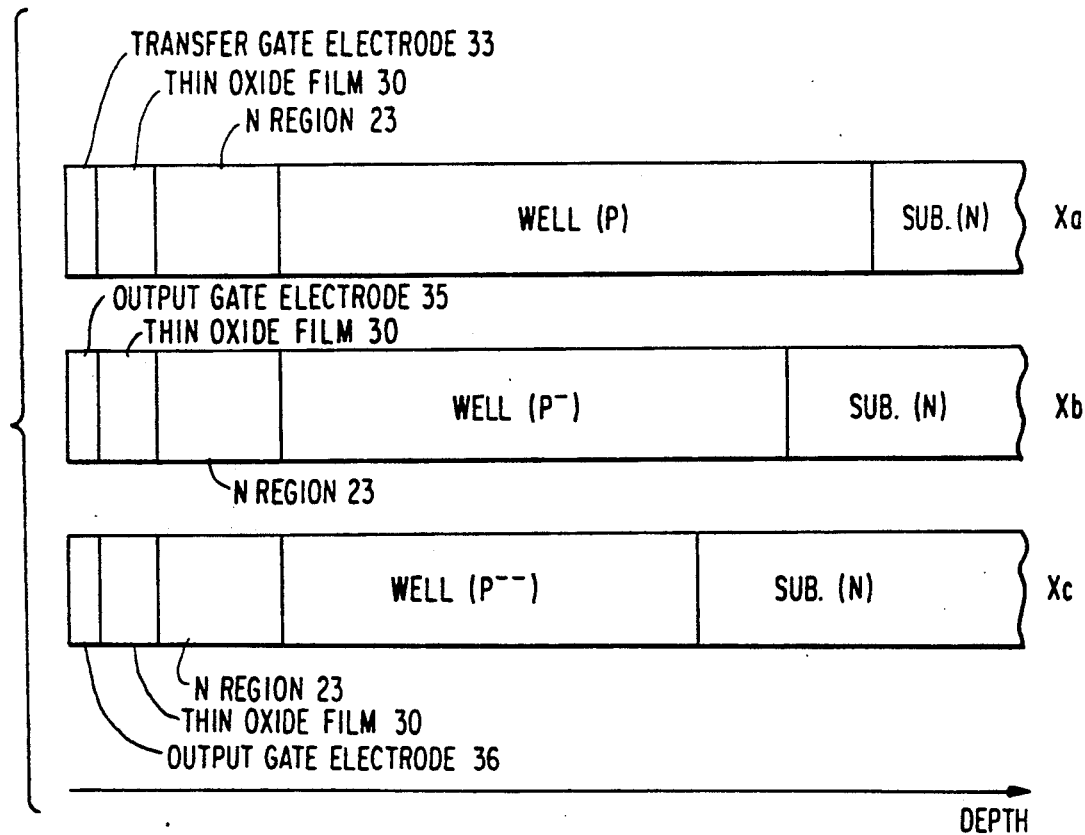
FIG. 11 is a graph showing the depth of a p-type well under electrodes incorporated in the charge transfer device shown in FIG. 4.

The potential profiles under the gate electrodes 33, 35 and 36 are shown in FIG. 10, and the depth of the p-type well 22 is shown along the respective lines Xa to Xc in FIG. 11. These figures clearly illustrate the variation of the potential level dependent on the impurity concentration which in turn is dependent on the depth of the p-type well 22.

Figure 15:
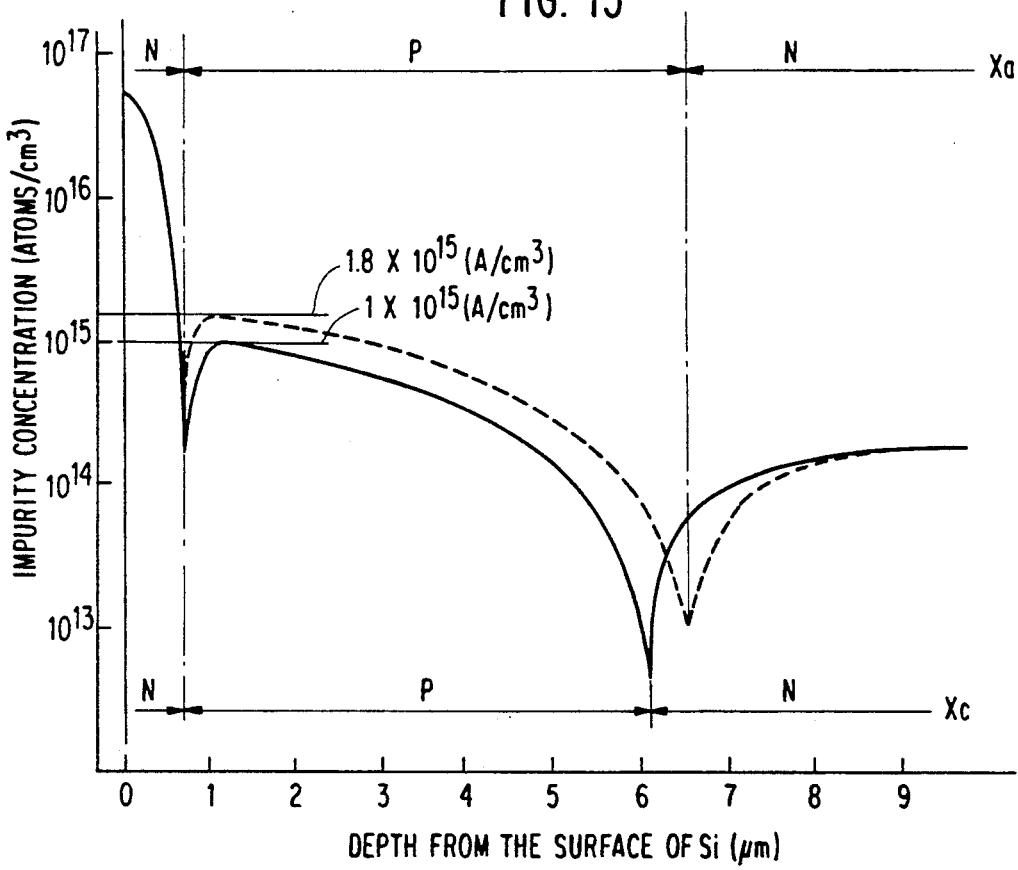
FIG. 15 is a graph showing impurity concentration in terms of depth from the surface of the silicon layer shown in FIGS. 7 and 9.

The impurity concentration along line Xa of FIG. 7 and the impurity concentration along line Xc of FIG. 9 are shown in FIG. 15. In FIG. 15, real line is indicative of the impurity concentration along line Xa, and broken line indicates the impurity concentration along line Xc. The peak impurity concentration of the p-type well 22 along line Xc is smaller than that along line Xa, and the p-type well 22 along line Xc is shallower than that along line Xa by about 0.6 microns. When the peak impurity concentration of the p-type well 22 is varied, the maximum potential under the gate electrode is varied.

Figure 16:
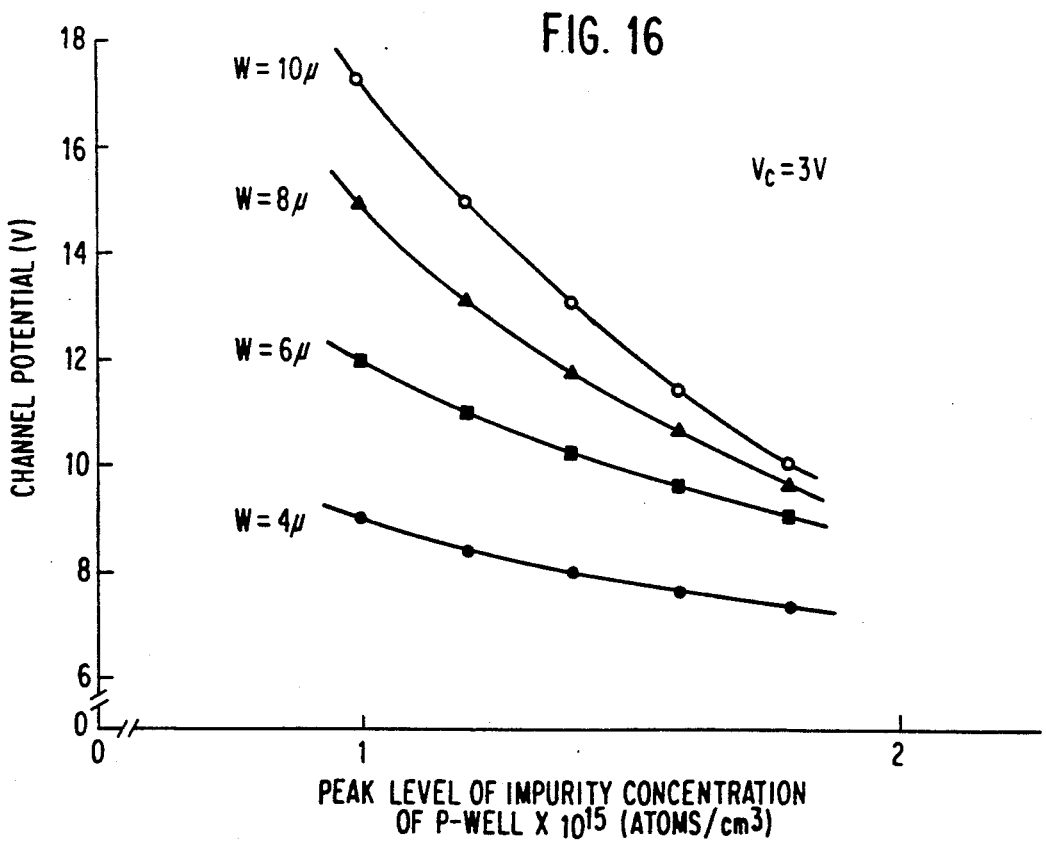
FIG. 16 is a graph showing channel potential in terms of peak level of impurity concentration of the p-type well.
Figure 17:
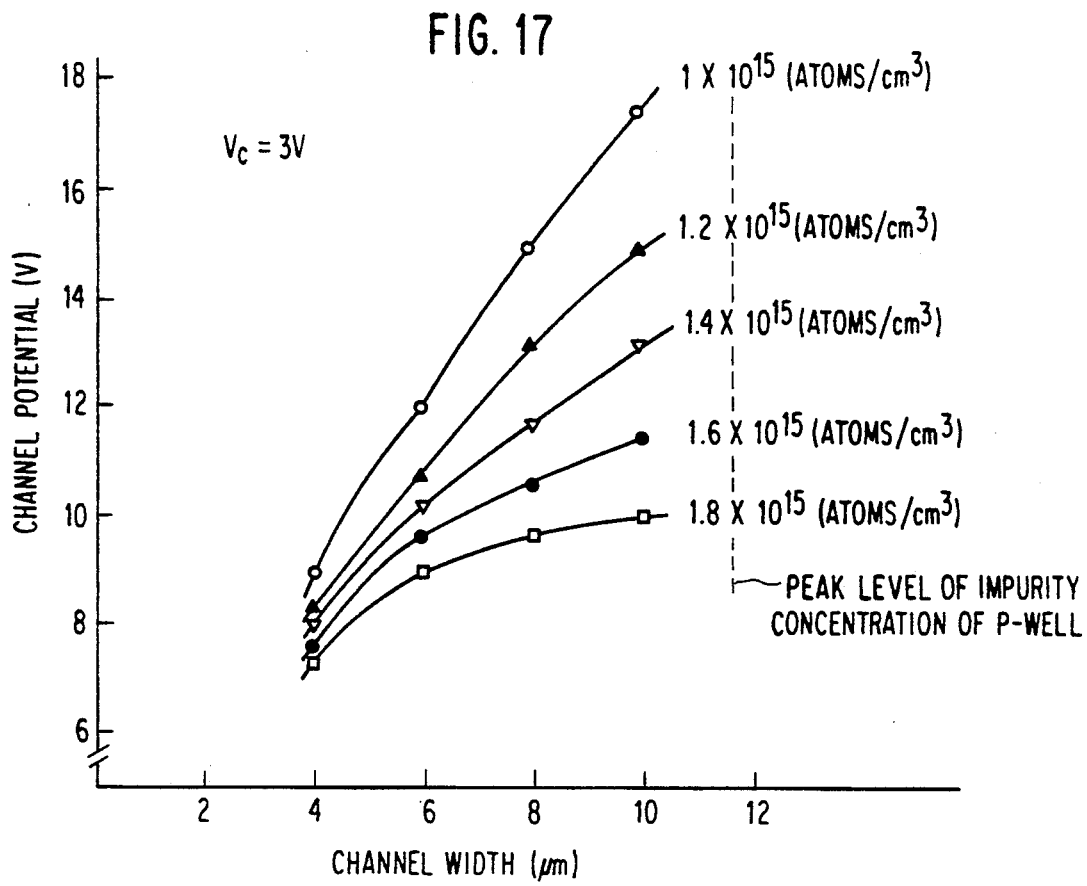
FIG. 17 is a graph showing the channel potential in terms of the channel width.

FIG. 16 shows the variation of the maximum potential under a gate voltage of 3 volts. Channel width is used as a parameter in FIG. 16. As will be understood from FIG. 16, the potential of channel is varied with the peak level of the impurity concentration in the p-type well 22, and the rate of change is dependent on the channel width. If the channel width is wider, the potential of the channel is widely changed with the peak level of the impurity concentration in the p-type well 22. In other words, while the width is small, the potential of the channel is hardly affected by the impurity concentration of the p-type well under the channel, because the influence of the narrow channel effect is large. This is clear from FIG. 17 which shows the peak value of the channel potential in terms of the channel width. While the impurity concentration of the p-type well under the channel remains small, the channel width has large influence on the rate of change of the channel potential, and the narrow channel phenomenon under a low impurity concentration in the p-type well is prominent.

Figure 18:
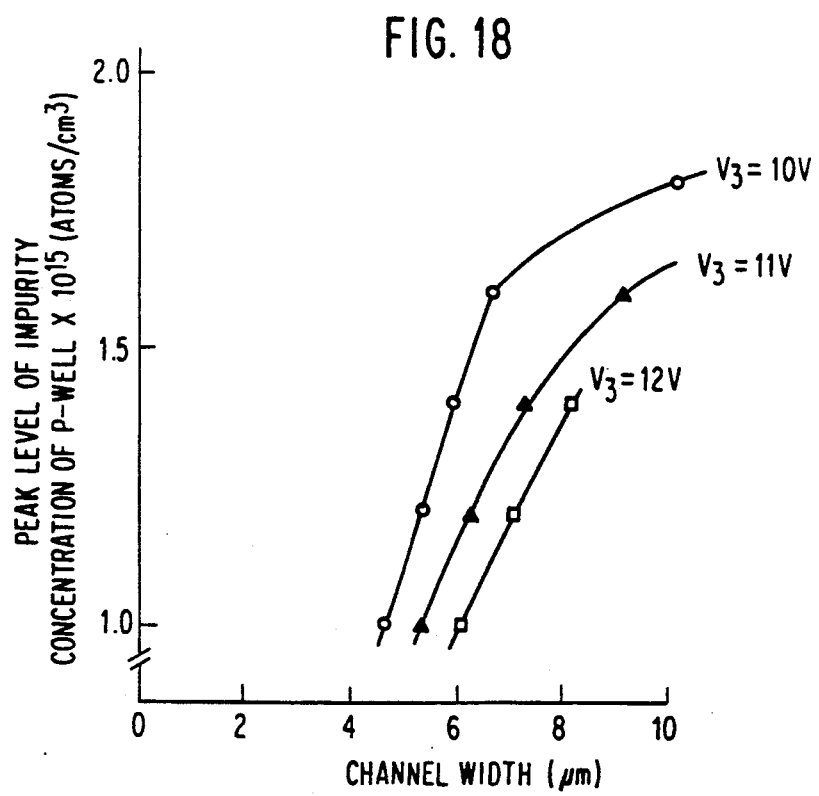
FIG. 18 is a graph showing the peak level of impurity concentration of the p-type well at $10^{15}$ atoms $cm^{-3}$ in terms of the channel width using the potential as a parameter.

As will be understood from the foregoing description, the profile of the impurity concentration of the p-type well 22 under the channel which is effective against the narrow channel phenomenon depends on the absolute value of the channel width and the necessary channel potential. However, an effective profile of impurity concentration against the narrow channel phenomenon is determined from FIG. 17, and any potential lift is restricted with the effective profile shown in FIG. 18. While the channel width ranges from 4 microns to 10 microns, FIG. 18 illustrates that it is necessary for the p-type well to have a profile of impurity concentration varying at $3 \times 10^{14}$ atoms cm$^{-14}$ along a channel width of 1 micron for preventing the channel from undesirable potential barrier. This results in a rate of change calculated as $(3 \times 10^{14})/(1.0 \times 10^{15}) = 0.3$. In other words, no potential barrier takes place under a profile of impurity concentration where the impurity concentration is decreased at 30% by decreasing the channel width by 1 micron.

Second Embodiment

Figure 12:
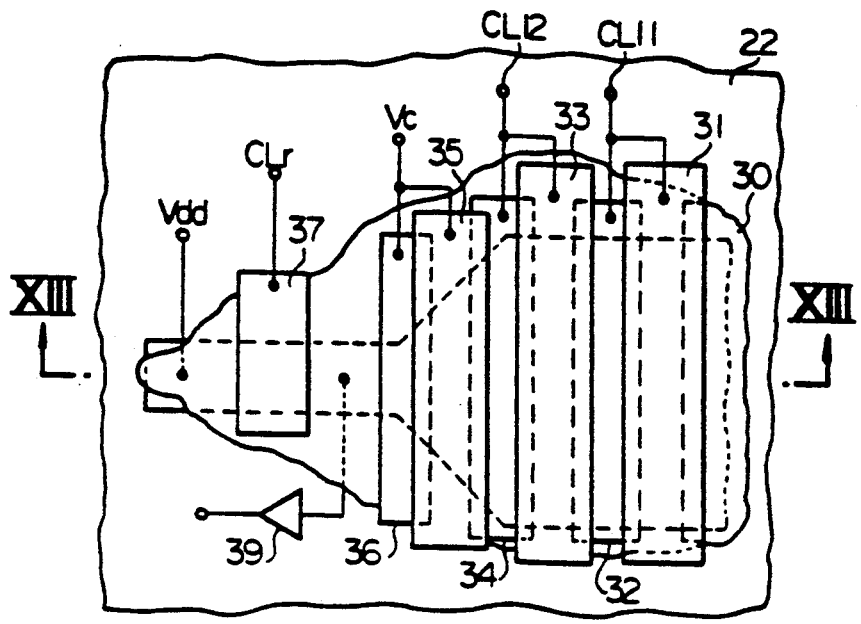
FIG. 12 is a plan view showing the layout of electrodes incorporated in another charge transfer device embodying the present invention.
Figure 13:
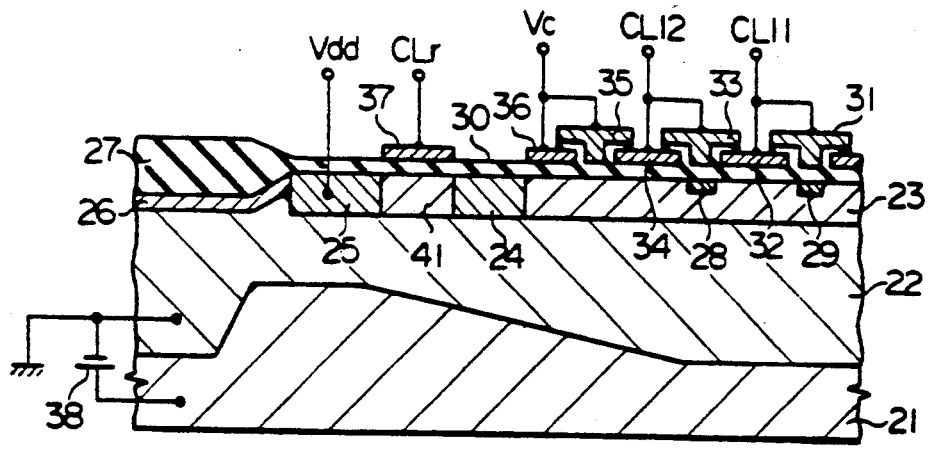
FIG. 13 is a cross sectional view showing the structure of the charge coupled device shown in FIG. 12.

Turning to FIGS. 12 and 13 of the drawings, another charge transfer device according to the present invention is illustrated. The charge transfer device shown in FIGS. 12 and 13 is similar to that shown in FIGS. 4 and 5 with the exception of a p-type region 41 between the n-type floating diffusion region 24 and the n-type drain region 25, and, for this reason, other component regions, films and electrodes are labeled with the same reference numerals used in FIGS. 4 and 5.

Figure 14:
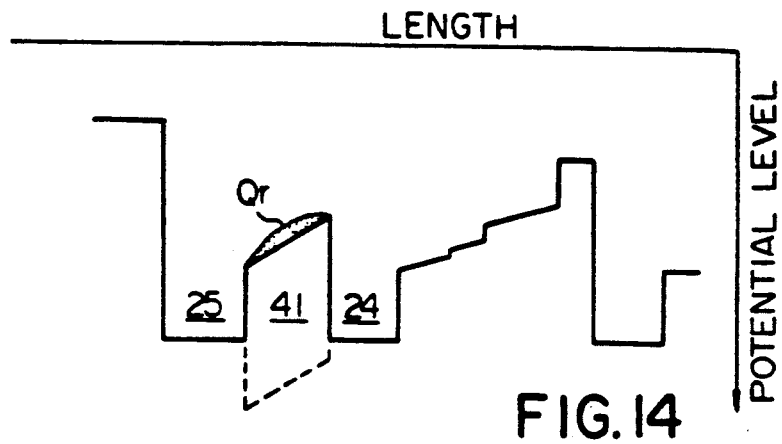
FIG. 14 is a diagram showing the potential profile produced along a charge transfer line of the charge transfer device shown in FIG. 13.

The p-type region 41 under the resetting gate electrode 37 is graded in the p-type impurity atom concentration, and, for this reason, a declining potential edge takes place in the p-type region 41 as will be seen from FIG. 14. The declining potential edge thus produced in the p-type impurity region 41 is advantageous in that electric charges Qr accumulated in the p-type region 41 in the presence of the reset pulse signal CLr are perfectly swept into the drain region 25 when the reset pulse signal CLr disappears. In other words, no electric charge reversely flows into the floating diffusion region 24, and, for this reason, a reset noise is drastically decreased. In this instance, the charge transfer line is prolonged to the p-type region 41.

As will be understood from the foregoing description, the charge transfer device according to the present invention achieves a large charge transfer ratio without any sacrifice of charge-to-voltage converting gain or an output signal range because the declining potential edge cancels the acclivity due to the narrow channel phenomenon. The declining potential edge is further operative to produce an electric field along the charge transfer line, so that the electric charges carrying data are accelerated toward the floating diffusion region 24. This results in improvement in operation speed.

Although particular embodiments of the present invention have been shown and described, it will be obvious to those skilled in the art that various changes and modifications may be made without departing from the spirit and scope of the present invention. For example, the charge transfer devices described hereinbefore have the respective graded regions at the terminal ends of the charge transfer lines, respectively. However, the declining potential edge may be produced throughout the charge transfer line, and the electric charges are transferred toward the floating diffusion region 24 much faster than the first and second embodiments by the agency of the electric field produced along the charge transfer line.

What is claimed is:

1. A charge transfer device fabricated on a semiconductor substrate of a first conductivity type, comprising:

a potential well formed in a surface portion of said semiconductor substrate and having a second conductivity type opposite to said first conductivity type;

a charge transfer region of said first conductivity type formed in a surface portion of said potential well, said charge transfer region being capable of transferring electric charge packets;

a floating diffusion region of said first conductivity type formed in the surface portion of said potential well and contiguous to said charge transfer region, said floating diffusion region being variable in voltage level due to said electric charge packets flowing thereinto so that an output voltage signal is produced;

an insulating film covering said surface portion of said potential well;

a plurality of gate electrodes provided on said insulating film; and means for sequentially applying voltages to said plurality of gate electrodes in such a manner as to produce said charge transfer region for transferring said charge packets toward said floating diffusion region, channel layers of said charge transfer region being decreased in width toward said floating diffusion region, said channel layers including a first narrow channel layer associated with a first gate electrode of said plurality of gate electrodes and a second narrow channel layer located between said floating diffusion region and said first narrow channel layer and associated with a second gate electrode of said plurality of gate electrodes, in which at least one of said first and second narrow channels has a conductive portion ranging from 4 microns to 10 microns in width, and in which a part of said potential well is associated with said conductive portion located below at least one of said first and second gate electrodes, wherein an impurity atom concentration of said part of said potential well is decreased at not less than 30% when the width of said conductive portion is decreased by 1 micron.

2. A charge transfer device as set forth in claim 1, wherein said first and second conductivity types are an n-type and a p-type, respectively.

3. A charge transfer device as set forth in claim 1, wherein every two of said gate electrodes are paired to form a gate electrode pair and partially overlapped with each other.

4. A charge transfer device as set forth in claim 3, wherein two of said gate electrodes paired with each other serve as an output gate electrode pair for allowing said electric charge packets to be swept into said floating diffusion region and the other gate electrodes serve as charge transfer gate electrode pairs.

5. A charge transfer device as set forth in claim 1, wherein said charge transfer device further comprises a drain region of said second conductivity type supplied with a constant voltage level and formed in the surface portion of said potential well, an intermediate region of said second conductivity type intervening between said floating diffusion region and said drain region, and a reset gate electrode formed over the intermediate region.

6. A charge transfer device as set forth in claim 5, wherein an impurity atom concentration of said intermediate region is decreased toward said drain region for smoothly sweeping said electric charge packets into said drain region upon application of voltage level to said reset gate electrode.

7. A charge transfer device as set forth in claim 6, wherein said impurity atom concentration of said intermediate region varies from $1.8 \times 10$ atoms cm$^{-3}$ to $1.0 \times 10$ atoms cm$^{-3}$.

* * * * *